United States Patent [19]
Kobayashi et al.

[11] Patent Number: 5,417,784
[45] Date of Patent: May 23, 1995

[54] METHOD OF MANUFACTURING LAMINATED ELECTRONIC COMPONENT

[75] Inventors: Motoo Kobayashi; Yukio Tanaka; Shoichi Kawabata; Toshihiko Kogame, all of Kyoto, Japan

[73] Assignee: Murata Manufacturing Co., Ltd., Kyoto, Japan

[21] Appl. No.: 10,444

[22] Filed: Jan. 22, 1993

Related U.S. Application Data

[63] Continuation of Ser. No. 592,855, Oct. 4, 1990, abandoned.

[30] Foreign Application Priority Data

Oct. 5, 1989 [JP] Japan .................................. 1-260745

[51] Int. Cl.⁶ ........................ B32B 31/04; B32B 18/00
[52] U.S. Cl. ........................... 156/64; 156/89; 156/235; 156/246
[58] Field of Search ............... 156/64, 89, 243, 246, 156/264, 261, 378; 83/50, 23; 356/429

[56] References Cited

U.S. PATENT DOCUMENTS

| | | | |
|---|---|---|---|
| 4,082,906 | 4/1978 | Amin et al. | 428/539 |
| 4,137,628 | 2/1979 | Suzuki | 29/625 |
| 4,497,677 | 2/1985 | Sanada et al. | 156/89 |
| 4,536,239 | 8/1985 | Benson | 156/64 |
| 4,539,058 | 9/1985 | Burgess et al. | 156/250 |
| 4,722,765 | 2/1988 | Ambros et al. | 156/630 |
| 4,749,421 | 6/1988 | Matsui et al. | 156/89 |
| 4,752,857 | 6/1988 | Khoury et al. | 361/321 |
| 4,805,499 | 2/1989 | Chiang | 83/71 |

*Primary Examiner*—Christopher A. Fiorilla
*Attorney, Agent, or Firm*—Ostrolenk, Faber, Gerb & Soffen

[57] ABSTRACT

A method of manufacturing a laminated electronic component such as a laminated ceramic capacitor, for example, which includes the steps of preparing a ceramic sheet provided with orientation marks, punching the ceramic sheet on the basis of the positions of the orientation marks, and stacking such ceramic sheets on the basis of the positions of the orientation marks. The punching step and the stacking step, which require alignment, are carried out on the basis of the positions of the orientation marks, whereby the ceramic sheets are stacked with high accuracy of alignment in the laminated electronic component as obtained.

20 Claims, 2 Drawing Sheets

METHOD OF MANUFACTURING LAMINATED ELECTRONIC COMPONENT

This is a continuation of application Ser. No. 07/592,855 filed on Oct. 4, 1990, now abandoned.

BACKGROUND OF THE INVENTION

1. Field of the Invention

The present invention relates to a method of manufacturing a laminated electronic component, and more particularly, it relates to a method of manufacturing a laminated electronic component which is formed by stacking ceramic sheets.

2. Description of the Background Art

A laminated electronic component is typified by a laminated ceramic capacitor, which in general is manufactured in the following manner:

(1) Ceramic sheets are punched into prescribed handling sizes. Thereafter end surfaces of the punched ceramic sheets are used as orientation surfaces for printing internal electrodes on the ceramic sheets. Then the internal electrodes are dried.

(2) A prescribed type of the ceramic sheets obtained in the above step (1) are stacked in a prescribed number using the end surfaces of the ceramic sheets as orientation surfaces similarly to the step (1).

(3) The stacked ceramic sheets are thermally compressed and subjected to a cutting step, a firing step and a step of forming external electrodes, in order to obtain a desired laminated ceramic capacitor.

In the aforementioned method of manufacturing a laminated ceramic capacitor, the end surfaces of the ceramic sheets are used as orientation surfaces for carrying out the steps (1) and (2). Thus, reliability in locating the ceramic sheets in the printing and stacking steps has been limited when the ceramic sheets have no rigidity.

When a laminated ceramic capacitor to be obtained is miniaturized, for example, high accuracy is required for the aforementioned location steps in order to properly oppose the internal electrodes to each other. Further, the ceramic sheets are increasingly lowered in rigidity when the same are reduced in thickness in order to attain high capacitance, to cause difficulty in locating them on the basis of the end surfaces thereof.

SUMMARY OF THE INVENTION

Accordingly, an object of the present invention is to provide a method of manufacturing a laminated electronic component which can advantageously solve the aforementioned problems in alignment even if the electronic component is miniaturized and high accuracy is required for alignment of internal electrodes, for example, or even if the ceramic sheets are reduced in thickness and lowered in rigidity.

The inventive method of manufacturing a laminated electronic component is characterized in that at least punching and stacking of ceramic sheets are performed on the basis of positions of orientation marks having constant positional relation with the ceramic sheets.

When the orientation marks are formed by printing, electrodes are preferably formed on the ceramic sheets simultaneously with formation of the orientation marks.

According to the inventive method of manufacturing a laminated electronic component, all steps requiring alignment can be carried out commonly on the basis of the positions of the orientation marks having constant positional relation with the ceramic sheets. Therefore, it is not necessary to use the end surfaces of the ceramic sheets as orientation surfaces, whereby the ceramic sheets can be aligned with high accuracy with no regard to rigidity of the ceramic sheets. Thus, it is easy to properly align thin ceramic sheets having low rigidity, for example, whereby it is possible to easily obtain a laminated electronic component such as a thin laminated ceramic capacitor having high capacitance.

When the orientation marks are provided in relation to the ceramic sheets in accordance with the present invention in a relatively initial step among the steps included in the method of manufacturing a laminated electronic component, the subsequent steps, particularly those requiring proper alignment, can be carried out on the basis of the positions of the orientation marks. Thus, it is not necessary to carry out multiple steps such as the punching step, the stacking step and the like in the same equipment in order to minimize errors that may be caused in alignment. Thus, the degree of freedom is increased in the structure of the equipment such that a multitype production line can be easily formed, for example.

According to the present invention, formation of electrodes, and more specifically, printing of internal electrodes for a laminated ceramic capacitor, for example, may be simultaneously achieved with printing of the orientation marks through the same printing plate (screen, for example). Thus, according to the present invention, it is not a mandatory requirement to form the electrodes on the basis of the positions of the orientation marks.

When the step of stacking the ceramic sheets is carried out after the punching step and the equipment used in the punching step can carry the ceramic sheets to a correct position in a regular manner for carrying out the stacking step, it is not necessary to relocate the ceramic sheets on the basis of the orientation marks for stacking the ceramic sheets so far as the ceramic sheets have been located through the orientation marks in the punching step. In such case, however, location of the ceramic sheets performed in the punching step on the basis of the orientation marks can be regarded as location based on the orientation marks for stacking the ceramic sheets. Thus, it is a mandatory requirement for the present invention to comprise "a step of stacking ceramic sheets on the basis of positions of orientation marks" including the above case.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
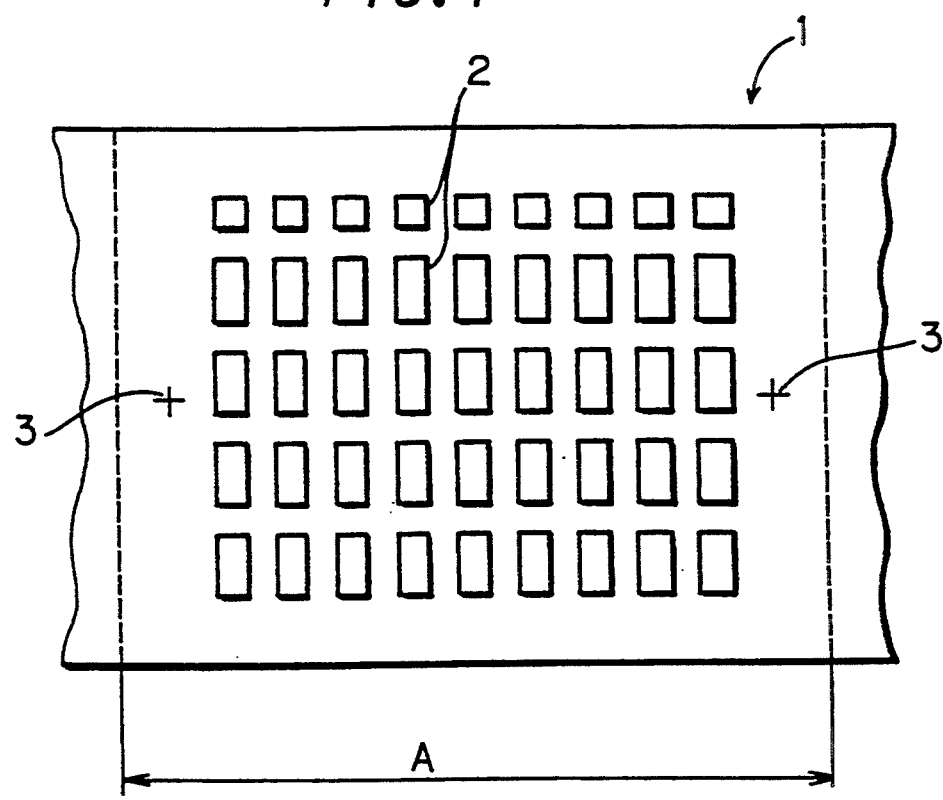
FIG. 1 is a plan view showing a ceramic sheet employed for carrying out an embodiment of the present invention.

FIG. 1 is a plan view showing a ceramic sheet 1 which is employed for carrying out an embodiment of the present invention. This ceramic sheet 1 is used for manufacturing laminated ceramic capacitors, which are exemplary laminated electronic components.

The ceramic sheet 1 is subjected to a later stacking step, and thereafter cut so as to obtain a number of laminated ceramic capacitors. Thus, a number of internal electrodes 2 are vertically and transversely arranged on the ceramic sheet 1. Two orientation marks 3, for example, are formed on the surface of the ceramic sheet 1 provided with the internal electrodes 2 in regions provided with no internal electrodes 2. The orientation marks 3, which are illustrated in cross-shaped configurations, for example, may have any arbitrary configurations such as circular, T-shaped or L-shaped configurations, for example. Although the ceramic sheet 1 is preferably provided with at least two such orientation marks 3, the same may alternatively be provided with only one such mark, for example. When the ceramic sheet 1 is provided with a plurality of orientation marks 3, the marks 3 are preferably separated as far as possible, in order to further improve accuracy in alignment.

The orientation marks 3 are preferably formed by printing, simultaneously with the internal electrodes 2. In this case, patterns for printing the orientation marks 3 may be formed in a screen for printing the internal electrodes 2.

The ceramic sheet has a longitudinal configuration and is successively fed increments of a predetermined portion having a size A as shown by the dotted lines in FIG. 1, so that the same is repeatedly printed with the internal electrodes 2 and the orientation marks 3 and dried.

Then, each predetermined portion on the ceramic sheet is is punched and stacked on the basis of the positions of the orientation marks 3.

In more concrete terms, the ceramic sheet is fed to a prescribed punching portion, where the orientation marks 3 are sensed and each predetermined portion on the ceramic sheet 1 is punched by a punching blade on the basis of the positions of the orientation marks 3. The ceramic sheet may be relatively roughly aligned at the punching portion, so that at least the orientation marks 3 can be sensed. The ceramic sheet 1 may be further provided with other sensing marks for such rough alignment. The orientation marks 3 may be sensed at the aforementioned punching portion by a well-known sensing technique through an image sensor or the like.

Then, punched ceramic sheets 1 are stacked on the basis of the positions of the orientation marks 3. The ceramic sheets 1 may be stacked in dies for compression, or on a simple plate. A laminate of the stacked ceramic sheets 1 is directly compressed when the ceramic sheets 1 are stacked in the dies for compression. When the ceramic sheets 1 are stacked on the simple plate, on the other hand, the laminate is carried into dies for compression and compressed therein.

When the aforementioned ceramic sheets 1 are punched and stacked in the same equipment, it may not be necessary to re-align the ceramic sheets 1 through the orientation marks 3. In this case, the orientation marks 3 may be removed in the step of punching the ceramic sheets 1.

The laminate of the ceramic sheets 1 compressed in the aforementioned manner is appropriately cut and subjected to a firing step and a step of forming external electrodes. Thus, desired laminated ceramic capacitors are obtained.

The orientation marks 3 may be formed by a method other than that employed in the aforementioned embodiment.

For example, the orientation marks 3 may be previously formed on the ceramic sheet 1, so that the internal electrodes 2 are printed on the basis of the positions of the orientation marks 3.

Further, the orientation marks 3 may be formed by a method of providing holes, in place of the printing method.

In addition, the orientation marks 3 may not necessarily be formed on the surface of the ceramic sheet 1 provided with the internal electrodes 2. When a ceramic sheet is backed with a backing sheet of polyethylene terephthalate or the like, for example, it is possible to form orientation marks on a surface opposite to that provided with internal electrodes, i.e., the backing sheet. Also when a ceramic sheet is independently handled, it is possible to form orientation marks on a surface opposite to that provided with internal electrodes.

Figure 2:
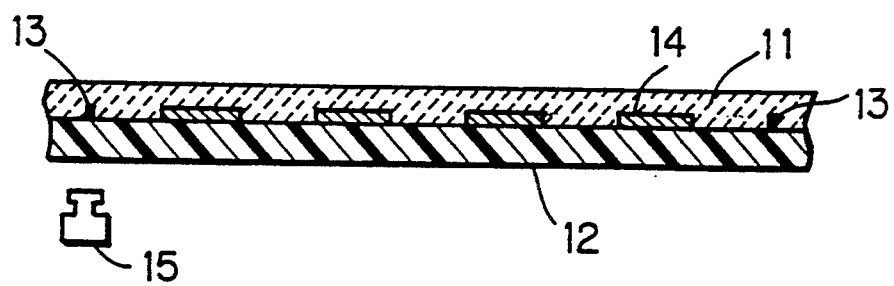
FIG. 2 is a sectional view showing a ceramic sheet backed with a backing sheet, which is employed for carrying out another embodiment of the present invention.

When a ceramic sheet 11 is backed with a backing sheet 12 as shown in FIG. 2, orientation marks 13 as well as internal electrodes 14 may be formed on a surface of the backing sheet 12 provided with the ceramic sheet 11. In this case, the internal electrodes 14 may be formed simultaneously with the orientation marks 13 by printing, for example. Alternatively, the internal electrodes 14 may be formed in another step on the basis of the positions of the orientation marks 13. The ceramic sheet 11 is formed on the backing sheet 12 which is provided with the orientation marks 13 and the internal electrodes 14.

The aforementioned backing sheet 12 is formed of a light transmissive material. The ceramic sheet 11 is sensed by a camera 15, for example, through the backing sheet 12, to be subjected to punching and stacking steps. When the ceramic sheet 11 is separated from the backing sheet 12, at least the internal electrodes 14 are transferred onto the ceramic sheet 11.

Figure 3:
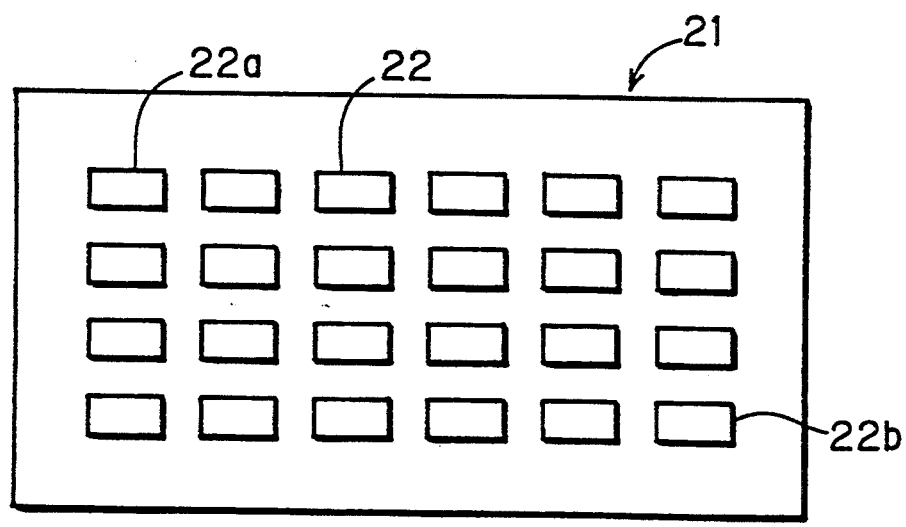
FIG. 3 is a plan view showing a ceramic sheet employed for carrying out still another embodiment of the present invention.

When a plurality of electrodes 22 are formed on a ceramic sheet 21 as shown in FIG. 3, specific ones of the electrodes 22 may be employed as orientation marks. In this case, the orientation marks are preferably defined by two of these electrodes 22, such as electrodes 22a and 22b, for example, which are diagonally opposite to each other and located in most separated positions.

Figure 4:
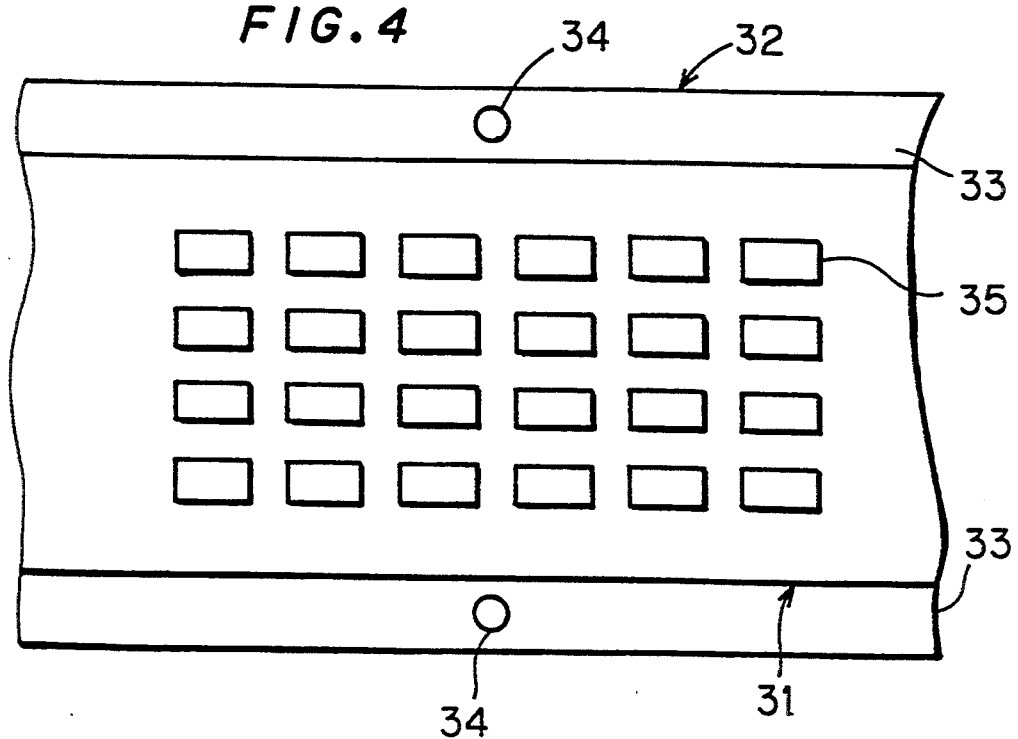
FIG. 4 is a plan view showing a ceramic sheet backed with a backing sheet, which is employed for carrying out a further embodiment of the present invention.

When a ceramic sheet 31 is formed on a backing sheet 32 by a doctor blade coater, for example, and the backing sheet 32 has portions 33 jutting out from the outlines of the ceramic sheet 31 as shown in FIG. 4, orientation marks 34 may be formed on the jutting portions 33. When electrodes 35 are formed on the ceramic sheet 31, the same may be formed simultaneously with the orientation marks 34, or in another step on the basis of the positions of the orientation marks 34.

Although the orientation marks 34 are provided in circular configurations in FIG. 4, the same may alternatively be provided in other configurations.

The present invention is also applicable to a method of manufacturing a laminated electronic component other than the laminated ceramic capacitor. For example, the inventive method can also be applied to manufacturing of a laminated electronic component such as a multilayer circuit board, a laminated type LC filter, an L-chip, a C-network, or the like.

Although embodiments of the present invention have been described and illustrated in detail, it is clearly understood that the same is by way of illustration and example only and is not to be taken by way of limitation, the spirit and scope of the present invention being limited only by the terms of the appended claims.

What is claimed is:

1. A method of laminating ceramic sheets comprising the steps of:
    (a) forming a longitudinal ceramic sheet having a plurality of portions to be punched and having a low rigidity;
    (b) forming a plurality of electrode patterns on the longitudinal ceramic sheet, and simultaneously, forming at least two orientation marks which are separate from the electrode patterns on each of the plurality of portions to be punched of the longitudinal ceramic sheet;
    (c) punching each of the plurality of portions to be punched of said ceramic sheet to form a plurality of punched portions while using said orientation marks as references to orient said ceramic sheet;
    (d) stacking said plurality of punched portions by sensing said orientation marks and using said orientation marks to orient said punched portions; and
    (e) laminating said punched portions stacked in said stacking step to form a laminated body.

2. A method of laminating ceramic sheets in accordance with claim 1, further comprising the step of cutting said laminated body into a plurality of separate parts.

3. A method of laminating ceramic sheets in accordance with claim 2, further comprising the step of firing said separate parts.

4. A method of laminating ceramic sheets in accordance with claim 2, wherein said orientation marks are optically sensed and used as references in said cutting step.

5. A method of laminating ceramic sheets in accordance with claim 1, wherein said orientation marks are optically sensed in said punching step.

6. A method of manufacturing a laminated electronic component in accordance with claim 1, wherein a plurality of non-identical electrode patterns are formed in said step of forming a plurality of electrode patterns.

7. A method of laminating ceramic sheets as claimed in claim 1, wherein said step of forming said longitudinal ceramic sheet comprises a step of forming said longitudinal ceramic sheet on a backing sheet.

8. A method of laminating ceramic sheets, comprising the steps of:
    (a) forming a plurality of electrode patterns on a backing sheet, and simultaneously, forming on the backing sheet at least two orientation marks to be separate from the electrode patterns;
    (b) forming a longitudinal ceramic sheet on the backing sheet, the ceramic sheet having a plurality of portions to be punched and having a low rigidity, said at least two orientation marks being located on said backing sheet so as to correspond to each of said plurality of portions to be punched of said ceramic sheet;
    (c) orienting said ceramic sheet by using said orientation marks as references;
    (d) separating said backing sheet from the ceramic sheet thereby transferring the electrode patterns from the backing sheet to said ceramic sheet;
    (e) punching each of the plurality of portions to be punched of said ceramic sheet to form a plurality of punched portions;
    (f) stacking said plurality of punched portions; and
    (g) laminating said punched portions stacked in said stacking step to form a laminated body.

9. A method of laminating ceramic sheets in accordance with claim 8, further comprising the step of cutting said laminated body into a plurality of separate parts.

10. A method of laminating ceramic sheets in accordance with claim 9, further comprising the step of firing said separate parts.

11. A method of laminating ceramic sheets in accordance with claim 8, wherein said orientation marks are optically sensed in said punching step.

12. A method of laminating ceramic sheets in accordance with claim 8, wherein the backing sheet includes at least one jutting portion extending beyond said ceramic sheet and said orientation marks are formed on the at least one jutting portion.

13. A method of laminating ceramic sheets in accordance with claim 8, wherein a plurality of non-identical electrode patterns are formed in said step of forming a plurality of electrode patterns.

14. A method of laminating ceramic sheets, comprising the steps of:
    (a) forming a longitudinal ceramic sheet on a backing sheet, the ceramic sheet having a plurality of portions to be punched and having a low rigidity;
    (b) forming a plurality of electrode patterns on the ceramic sheet, and simultaneously, forming on the backing sheet at least two orientation marks corresponding to each of said plurality of portions to be punched of said ceramic sheet, the orientation marks being separate from said electrode patterns;
    (c) orienting said ceramic sheet by using said orientation marks as references;
    (d) separating said backing sheet from the ceramic sheet;
    (e) punching each of the plurality of portions to be punched of said ceramic sheet to form a plurality of punched portions;
    (f) stacking said plurality of punched portions; and
    (g) laminating said punched portions stacked in said stacking step to form a laminated body.

15. The method of laminating ceramic sheets in accordance with claim 14, wherein said backing sheet has at least one jutting portion extending beyond said ceramic sheet and said orientation marks are formed on said at least one jutting portion.

16. The method of laminating ceramic sheets in accordance with claim 14, further comprising the step of cutting said laminated body into a plurality of separate parts.

17. A method of laminating ceramic sheets in accordance with claim 16, further comprising the step of firing said separate parts.

18. A method of laminating ceramic sheets in accordance with claim 14, wherein said orientation marks are optically sensed in said step of orienting said ceramic sheet.

19. A method of laminating ceramic sheets in accordance with claim 14, wherein the ceramic sheet includes a plurality of outlines and said orientation marks are formed on a portion of the backing sheet that extends beyond the plurality of outlines.

20. A method of laminating ceramic sheets in accordance, with claim 14, wherein a plurality of non-identical electrode patterns are formed in said step of forming a plurality of electrode patterns.

* * * * *